United States Patent
Anglin et al.

(10) Patent No.: US 10,410,844 B2
(45) Date of Patent: Sep. 10, 2019

(54) RF CLEAN SYSTEM FOR ELECTROSTATIC ELEMENTS

(71) Applicant: Varian Semiconductor Equipment Associates, Inc., Gloucester, MA (US)

(72) Inventors: Kevin Anglin, Somerville, MA (US); Brant S. Binns, Beverly, MA (US); Peter F. Kurunczi, Cambridge, MA (US); Jay T. Scheuer, Rowley, MA (US); Eric Hermanson, Georgetown, MA (US); Alexandre Likhanskii, Malden, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 84 days.

(21) Appl. No.: 15/427,336

(22) Filed: Feb. 8, 2017

(65) Prior Publication Data
US 2018/0166261 A1 Jun. 14, 2018

Related U.S. Application Data

(60) Provisional application No. 62/432,348, filed on Dec. 9, 2016.

(51) Int. Cl.
  *H01J 37/36* (2006.01)
  *B08B 7/00* (2006.01)
  (Continued)

(52) U.S. Cl.
  CPC .......... *H01J 37/32862* (2013.01); *B08B 5/00* (2013.01); *B08B 7/0035* (2013.01);
  (Continued)

(58) Field of Classification Search
  None
  See application file for complete search history.

(56) References Cited

U.S. PATENT DOCUMENTS

| 5,633,506 | A | * | 5/1997 | Blake | H01J 37/3002 |
|---|---|---|---|---|---|
| | | | | | 250/251 |
| 6,992,311 | B1 | * | 1/2006 | Ring | H01J 37/3171 |
| | | | | | 250/423 R |

(Continued)

FOREIGN PATENT DOCUMENTS

GB 1479033 A * 7/1977 ............... B03C 3/38

OTHER PUBLICATIONS

International Search Report and Written Opinion dated Mar. 6, 2018 for PCT/US2017/060387 filed Nov. 7, 2017.

*Primary Examiner* — Michael J Logie

(57) ABSTRACT

Provided herein are approaches for in-situ plasma cleaning of one or more components of an ion implantation system. In one approach, the component may include a beam-line component, such as an energy purity module, having a plurality of conductive beam optics contained therein. The system further includes a power supply system for supplying a voltage and a current to the beam-line component during a cleaning mode, wherein the power supply system may include a first power plug coupled to a first subset of the plurality of conductive beam optics and a second power plug coupled to a second subset of the plurality of conductive beam optics. During a cleaning mode, the voltage and current may be simultaneously supplied and split between each of the first and second power plugs.

10 Claims, 9 Drawing Sheets

(51) Int. Cl.
*H01J 37/32* (2006.01)
*H01J 37/317* (2006.01)
*B08B 5/00* (2006.01)

(52) U.S. Cl.
CPC .......... *H01J 37/3171* (2013.01); *H01J 37/36* (2013.01); *H01J 2237/022* (2013.01); *H01J 2237/057* (2013.01); *H01J 2237/335* (2013.01)

(56) References Cited

U.S. PATENT DOCUMENTS

| | | | | |
|---|---|---|---|---|
| 8,604,418 B2* | 12/2013 | Colvin | ............ | H01J 37/04 250/281 |
| 2005/0016838 A1* | 1/2005 | Murata | ............ | H01J 27/16 204/192.32 |
| 2007/0137671 A1* | 6/2007 | DiVergilio | ............ | B08B 7/0035 134/1 |
| 2011/0155921 A1* | 6/2011 | Kellerman | ............ | H01J 37/1477 250/396 R |
| 2011/0241547 A1* | 10/2011 | Wei | ............ | H01J 37/32091 315/111.21 |
| 2012/0168637 A1* | 7/2012 | Radovanov | ............ | H01J 37/12 250/396 R |
| 2014/0041684 A1* | 2/2014 | Kurunczi | ............ | B08B 7/0021 134/1.1 |
| 2014/0110598 A1 | 4/2014 | Wu et al. | | |
| 2014/0319369 A1 | 10/2014 | Koo et al. | | |
| 2015/0048254 A1 | 2/2015 | Naumovski et al. | | |
| 2015/0056380 A1 | 2/2015 | Savas et al. | | |
| 2015/0101634 A1* | 4/2015 | Leavitt | ............ | H01J 27/022 134/1.1 |
| 2015/0357152 A1 | 12/2015 | Jones et al. | | |
| 2016/0365225 A1* | 12/2016 | Anglin | ............ | H01J 37/32862 |
| 2017/0092473 A1* | 3/2017 | Lee | ............ | H01J 37/32862 |
| 2017/0221678 A1* | 8/2017 | Likhanskii | ............ | H01J 37/3007 |

* cited by examiner

RF CLEAN SYSTEM FOR ELECTROSTATIC ELEMENTS

CROSS-REFERENCE TO RELATED APPLICATION

This application claims priority to U.S. Provisional Patent Application No. 62/432,348, filed Dec. 9, 2016, entitled "RF CLEAN SYSTEM FOR ELECTROSTATIC ELEMENTS," and incorporated by reference herein in its entirety.

FIELD OF THE DISCLOSURE

The disclosure relates generally to techniques for improving the performance and extending the lifetime of components within a processing chamber and, more particularly, to a portable cleaning system for etching electrostatic elements of an ion implantation system.

BACKGROUND OF THE DISCLOSURE

Ion implantation systems may include an ion source and a series of beam-line components. The ion source may comprise a chamber where ions are generated. The ion source may also comprise a power source and an extraction electrode assembly disposed near the chamber. The beam-line components may include, for example, a mass analyzer, a first acceleration or deceleration stage, a collimator, and a second acceleration or deceleration stage. Similar to a series of optical lenses for manipulating a light beam, the beam-line components can filter, focus, and manipulate ions or an ion beam to have an intended species, shape, energy, and/or other qualities. The ion beam passes through the beam-line components and may be directed toward a substrate mounted on a platen or clamp. The substrate may be moved in one or more dimensions (e.g., translate, rotate, and tilt) by an apparatus, sometimes referred to as a roplat.

The ion implantation system generates a stable, well-defined ion beam for a variety of different ion species and extraction voltages. After several hours of operation using source gases (such as $AsH_3$, $PH_3$, $BF_3$, and other species), beam constituents eventually create deposits on beam optics. Beam optics within a line-of-sight of the wafer also become coated with residues from the wafer, including Si and photoresist compounds. These residues build up on the beam-line components, causing spikes in the DC potentials during operation (e.g., in the case of electrically biased components). Eventually, residues flake off, causing an increased likelihood of particulate contamination on the wafer.

One way to mitigate the effect of the material accumulation is to intermittently replace beam-line components of the ion implanter system. Alternatively, beam-line components may be manually cleaned. Yet, manually cleaning entails powering down the ion source and releasing the vacuum within the system. After replacing or cleaning the beam-line components, the system is then evacuated and powered to reach an operational condition. Accordingly, these maintenance processes may be time consuming and inefficient, as the beam-line component is not being used. As such, frequent maintenance processes may decrease the time available for IC production, thus increasing overall manufacturing cost.

SUMMARY

In view of the foregoing, provided herein are systems and methods for in-situ plasma cleaning of ion implantation system components (e.g., ion beam optics), wherein the in-situ plasma cleaning may be performed over a short time, avoiding the need to vent and/or manually clean the ion beam optics. Moreover, provided herein are systems and methods for in-situ plasma cleaning of ion beam optics in an energy purity module (EPM) using a set of power plugs connected to the ion beam optics of the EPM.

An exemplary system in accordance with the present disclosure may include a plurality of electrostatic elements disposed within a chamber. The system may further include a power supply system in communication with the plurality of electrostatic elements. The power supply system may comprise a first power plug and a second power plug for supplying a voltage and a current to the plurality of electrostatic elements during a cleaning mode. The first power plug may be coupled to a first subset of the plurality of electrostatic elements and the second power plug is coupled to a second subset of the plurality of electrostatic elements.

An exemplary ion implantation system in accordance with the present disclosure may include an energy purity module (EPM) having a chamber for generating a plasma, the EPM including a plurality of conductive beam optics disposed along an ion beam-line. The ion implantation system may further include a power supply system in communication with the plurality of conductive beam optics. The power supply system may comprise a first power plug and a second power plug for supplying a voltage and a current to the plurality of conductive beam optics during a cleaning mode to generate a plasma around the plurality of conductive beam optics. The first power plug may be coupled to a first subset of the plurality of conductive beam optics and the second power plug coupled to a second subset of the plurality of conductive beam optics.

An exemplary method in accordance with the present disclosure may include providing a plurality of electrostatic elements within a chamber of an energy purity module (EPM), wherein the process chamber is operable for generating a plasma. The method may further include supplying a voltage and a current to the plurality of electrostatic elements during a cleaning mode to generate the plasma around the plurality of electrostatic elements. The voltage and the current may be supplied to a first subset of the plurality of electrostatic elements by a first power plug, and the voltage and the current may be supplied to a second subset of the plurality of electrostatic elements by a second power plug.

Figure 1:
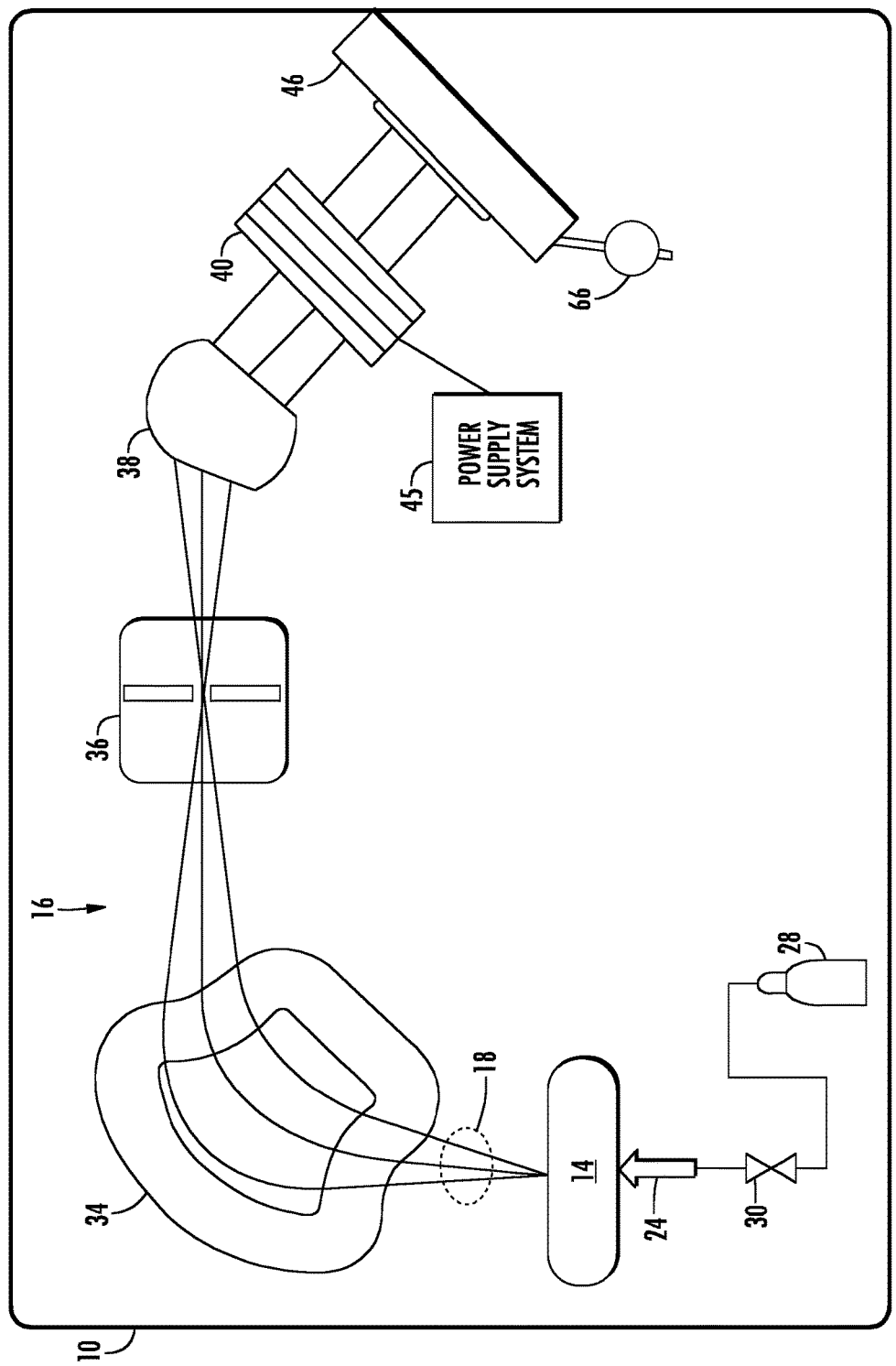
FIG. 1 is a schematic view illustrating an ion implantation system in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

A system and method in accordance with the present disclosure will now be described more fully hereinafter with reference to the accompanying drawings, where embodiments of the system and method are shown. The system and method may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts. These terms are to be interpreted with respect to the geometry and orientation of components or devices appearing in the figures. The terminology will include the words specifically mentioned, derivatives thereof, and words of similar import.

As used herein, an element or operation recited in the singular and proceeded with the word "a" or "an" are understood as potentially including plural elements or operations until such exclusion is explicitly recited. Furthermore, references to "one embodiment" of the present disclosure are not intended to be interpreted as preventing the existence of additional embodiments also incorporating the recited features.

As stated above, provided herein are approaches for in-situ plasma cleaning of one or more components of an ion implantation system. In one approach, the component may include a beam-line component, such as an energy purity module (EPM), having a plurality of electrostatic elements. In some embodiments, the plurality of electrostatic elements includes acceleration/deceleration and focus conductive beam optics (e.g., graphite rods). The system further includes a power supply system for supplying a voltage and a current to the beam-line component during a cleaning mode. The power supply system may include a first power plug coupled to a first end of the plurality of electrostatic elements and a second power plug coupled to a second end of the plurality of electrostatic elements. More specifically, a first subset of the plurality of electrostatic elements (e.g., ½ of the accel/decel conductive beam optics) may be electrically coupled to the first power plug. A second subset of the plurality of electrostatic elements (e.g., other ½ of the accel/decel conductive beam optics) may be electrically coupled to the second power plug. During the cleaning mode, the voltage and the current may be simultaneously supplied and split between each of the first and second power plugs.

In some embodiments, the power supply system may include a first power distribution plate and a second power distribution plate electrically coupled to an inductor, wherein the first power distribution plate is electrically coupled with the first subset of the plurality of electrostatic elements. The second power distribution plate may be electrically coupled with the second subset of plurality of electrostatic elements. The power supply system may further include an additional power distribution plate disposed in proximity to the first and second power distribution plates. The additional distribution plate may be electrically coupled with at least one additional electrostatic element (e.g., focus conductive beam optics) having a different electrical impedance than those electrostatic elements coupled to the first and second power distribution plates. In some embodiments, the focus distribution plate is not directly coupled to the inductor because doing so would result in uneven plasma density. Instead, the oscillating voltage from the nearby first and second power distribution plates can capacitively or inductively couple to the additional power distribution plate devoid a direct physical/electrical connection to provide a reduced amount of RF power to the at least one additional electrostatic element.

In some embodiments, the hardware of the power supply system may be included within a standalone/portable RF clean service cart, providing the ability to quickly connect and interface with the EPM of the ion implantation system. The power supply system is designed to allow a full EPM clean in a relatively shorter period of time (e.g., less than 1 hour). Furthermore, avoiding major modifications to the EPM, the in-situ cleaning method described herein can employ high gas flow rates, chemically reactive species formation, ion bombardment, and surface heating for a combined highly efficient process. Cleaning beam transport optics closer to the process chamber positively impacts different tool functionalities of the ion implantation process and can directly influence wafer particle adder counts.

Referring now to FIG. 1, an exemplary embodiment demonstrating an ion implantation system (hereinafter "system") 10 for performing in-situ plasma cleaning of one or more components of an ion implantation system in accordance with the present disclosure is shown. The system represents a process chamber containing, among other components, an ion source 14 for producing an ion beam 18, an ion implanter, and a series of beam-line components. The ion source 14 may comprise a chamber for receiving a flow of gas 24 and generating ions. The ion source 14 may also comprise a power source and an extraction electrode assembly disposed near the chamber. The beam-line components 16 may include, for example, a mass analyzer 34, a first acceleration or deceleration stage 36, a collimator 38, and an energy purity module (EPM) 40 corresponding to a second acceleration or deceleration stage. Although described hereinafter with respect to the EPM 40 of the beam-line components 16 for the sake of explanation, the embodiments described herein for in-situ plasma cleaning are also applicable to different/additional components of the system 10 using a portable power supply system 45.

In exemplary embodiments, the beam-line components 16 may filter, focus, and manipulate ions or the ion beam 18 to have an intended species, shape, energy, and other qualities.

The ion beam 18 passing through the beam-line components 16 may be directed toward a substrate mounted on a platen or clamp within a process chamber 46. The substrate may be moved in one or more dimensions (e.g., translate, rotate, and tilt).

As shown, there may be one or more feed sources 28 operable with the chamber of the ion source 14. In some embodiments, material provided from the feed source 28 may include source material and/or additional material. The source material may contain dopant species introduced into the substrate in the form of ions. Meanwhile, the additional material may include diluent, introduced into the ion source chamber of the ion source 14 along with the source material to dilute the concentration of the source material in the chamber of the ion source 14. The additional material may also include a cleaning agent (e.g., an etchant gas) introduced into the chamber of the ion source 14 and transported within the system 10 to clean one or more of the beam-line components 16.

In various embodiments, different species may be used as the source and/or the additional material. Examples of the source and/or additional material may include atomic or molecular species containing boron (B), carbon (C), oxygen (O), germanium (Ge), phosphorus (P), arsenic (As), silicon (Si), helium (He), neon (Ne), argon (Ar), krypton (Kr), nitrogen (N), hydrogen (H), fluorine (F), and chlorine (Cl). Those of ordinary skill in the art will recognize the above listed species are non-limiting, and other atomic or molecular species may also be used. Depending on the application(s), the species may be used as the dopants or the additional material. In particular, one species used as the dopants in one application may be used as the additional material in another application, or vice-versa.

In exemplary embodiments, the source and/or additional material is provided into the ion source chamber of the ion source 14 in gaseous or vapor form. If the source and/or additional material is in non-gaseous or non-vapor form, a vaporizer (not shown) may be provided near the feed source 28 to convert the material into gaseous or vapor form. To control the amount and the rate the source and/or the additional material is provided into the system 10, a flowrate controller 30 may be provided.

The EPM 40 is a beam-line component configured to independently control deflection, deceleration, and focus of the ion beam 18. In one embodiment, the EPM 40 is a vertical electrostatic energy filter (VEEF) or electrostatic filter (EF). As will be described in greater detail below, the EPM 40 may include an electrode configuration comprising a set of upper electrodes disposed above the ion beam 18 and a set of lower electrodes disposed below the ion beam 18, as well as a set of focus electrodes arranged between the set of upper and set of lower electrodes. The set of upper electrodes and the set of lower electrodes may be stationary and have fixed positions. A difference in potentials between the set of upper electrodes and the set of lower electrodes may also be varied along the central ion beam trajectory to reflect an energy of the ion beam at each point along the central ion beam trajectory for independently controlling deflection, deceleration, and/or focus of an ion beam.

Figure 2:
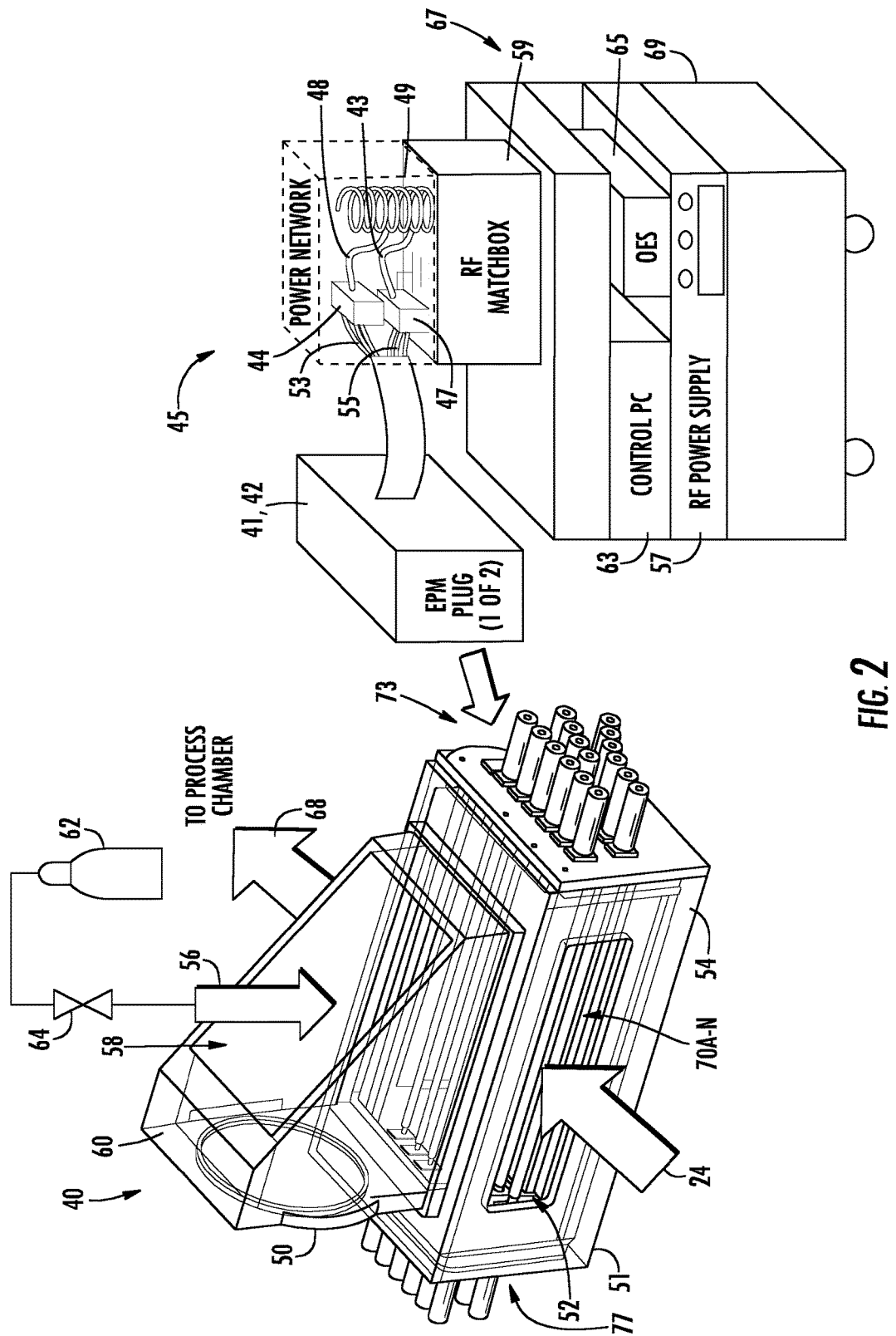
FIG. 2 is an isometric view illustrating a power supply system and energy purity module (EPM) of the ion implantation system shown in FIG. 1 in accordance with embodiments of the present disclosure.

Referring now to FIG. 2, the EPM 40 according to exemplary embodiments will be described in greater detail. As shown, the EPM 40 includes an EPM chamber 50 extending above a frame 51 of the EPM 40. The EPM chamber 50 is configured to receive a gas and generate a plasma therein. In one embodiment, as shown, the EPM chamber 50 may receive a flow of the gas 24 from the ion source 14 (FIG. 1) at a gas inlet 52 through a sidewall 54.

In another embodiment, the EPM chamber 50 may receive a flow of gas 56 at a gas inlet 58 through a top section 60 of the EPM chamber 50. The gas 56 may be supplied from a supplementary gas source 62 separate from the flow of gas 24 from the ion source 14. In this embodiment, an injection rate of the gas 56 into the EPM chamber 50 may be controlled by a flow controller 64 (e.g., a valve).

The EPM 40 further operates with one or more vacuum pumps 66 (FIG. 1) to adjust a pressure of the EPM chamber 50. In exemplary embodiments, the vacuum pump 66 is coupled to the process chamber 46, and pressure is adjusted within the EPM chamber 50 through one or more flow paths 68. In another embodiment, the EPM 40 may include one or more additional pumps more directly coupled to the EPM chamber 50.

Figure 3:
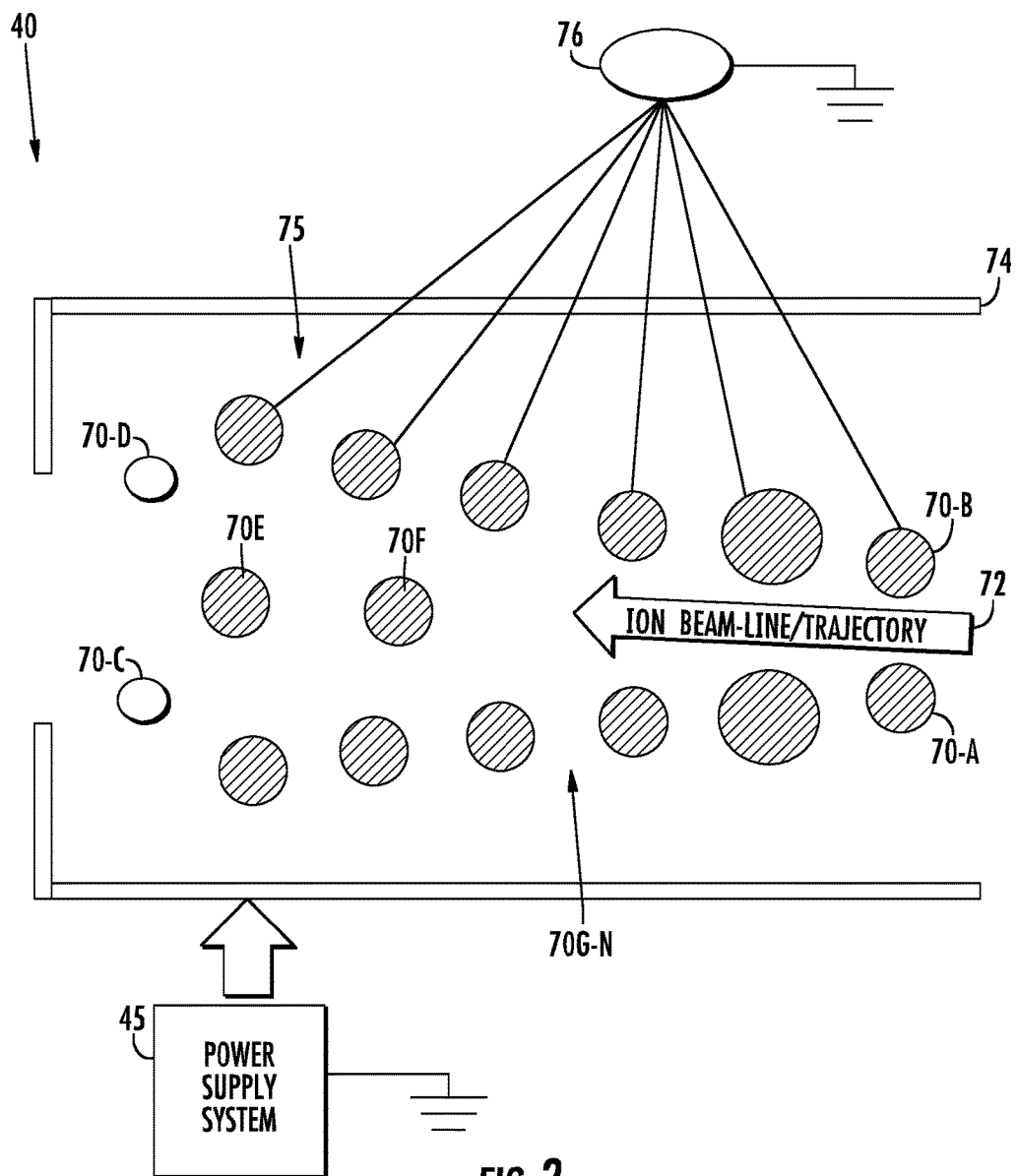
FIG. 3 is a partial side cutaway view of the EPM of the ion implantation system shown in FIG. 1 in accordance with embodiments of the present disclosure.

Referring now to FIGS. 2-3, an exemplary embodiment demonstrating the structure and operation of the EPM 40 and a power supply system in accordance with the present disclosure is shown. The EPM 40 includes a plurality of electrostatic elements, for example, electrode rods, and will hereafter also be referred to as conductive beam optics 70A-N. As shown, the plurality of conductive beam optics 70A-N may be disposed along an ion beam-line/trajectory 72, and include a first end 73 and a second end 77. In this embodiment, the conductive beam optics 70A-N are arranged in a symmetrical configuration. For example, the conductive beam optics 70A-B represent a set of entrance electrodes, the conductive beam optics 70C-D represent a set of exit electrodes, the conductive beam optics 70E-F represent a set of focus electrodes, and the remaining beam optics 70G-N represent several sets of suppression/focusing electrodes. In another embodiment, the conductive beam optics 70A-N may be arranged in an asymmetrical configuration. As shown, each set of electrode pairs provides a space/opening to allow the ion beam (e.g., a ribbon beam) to pass therethrough. In exemplary embodiments, the conductive beam optics 70A-N are provided in a housing 74. As described above, the vacuum pump 66 may be directly or indirectly connected to the housing 74 for adjusting a pressure of an environment 75 therein.

In some embodiments, the conductive beam optics 70A-N include pairs of conductive pieces electrically coupled to each other. Alternatively, the conductive beam optics 70A-N may be a series of unitary structures each including an aperture for the ion beam to pass therethrough. In the embodiment shown, upper and lower portions of each electrode pair may have different potentials (e.g., in separate conductive pieces) in order to deflect the ion beam passing therethrough.

In some embodiments, the ion beam passing through the electrodes along the ion beam-line 72 may include boron or other elements. Electrostatic focusing of the ion beam may be achieved by using several thin electrodes (e.g., the suppression/focusing electrodes of conductive beam optics 70E-F) to control grading of potential along the ion beam-line 72. In the configuration of conductive beam optics 70A-N shown, high deceleration ratios may also be provided. As a result, use of input ion beams may be used in an energy range to enable higher quality beams, even for very low energy output beams. Furthermore, in some embodiments, at least one (e.g., focus conductive beam optics 70E-F) of the plurality of conductive beam optics 70A-N may have a different impedance (e.g., due to material composition, size, geometry, and distance from ground planes) than another one of the plurality of conductive beam optics 70A-N.

As noted above, one cause of degradation to the system 10 (FIG. 1) may be excessive accumulation of deposits or by-products generated by the beam constituents during use. For example, deposits may accumulate on the conductive beam optics 70A-N of the EPM 40, as well as on other components of the system 10. In some embodiments, this accumulation of material may be more severe, e.g., when carborane, $SiF_4$ or $GeF_4$ is used as the source material. To prevent excessive accumulation, the system 10 of the present disclosure may operate in two modes: a processing mode and a cleaning mode. During the processing mode, the system 10 may operate normally to produce the ion beam 18. During the cleaning mode, the EPM 40, or any other component of the system 10, such as beam-line components 16, may be in-situ cleaned. As will be described in greater detail below, during the cleaning mode, the power supply system 45 couples to the EPM 40 to generate an increased plasma around each of the plurality of electrostatic elements of the EPM 40.

During a processing mode, an operating power supply 76 (e.g., a series of DC power supplies) supplies a first voltage and a first current to the electrostatic elements of the EPM 40. In one embodiment, the conductive beam optics 70A-N are held at a series of DC potentials from 0.1 keV-100 keV. In cleaning mode, the power supply system may be configured to supply a second voltage and a second current to the plurality of electrostatic elements to generate the plasma around the plurality of electrostatic elements. In various embodiments, the voltage and current provided by the operating power supply 76 may be constant or varied.

Figure 4:
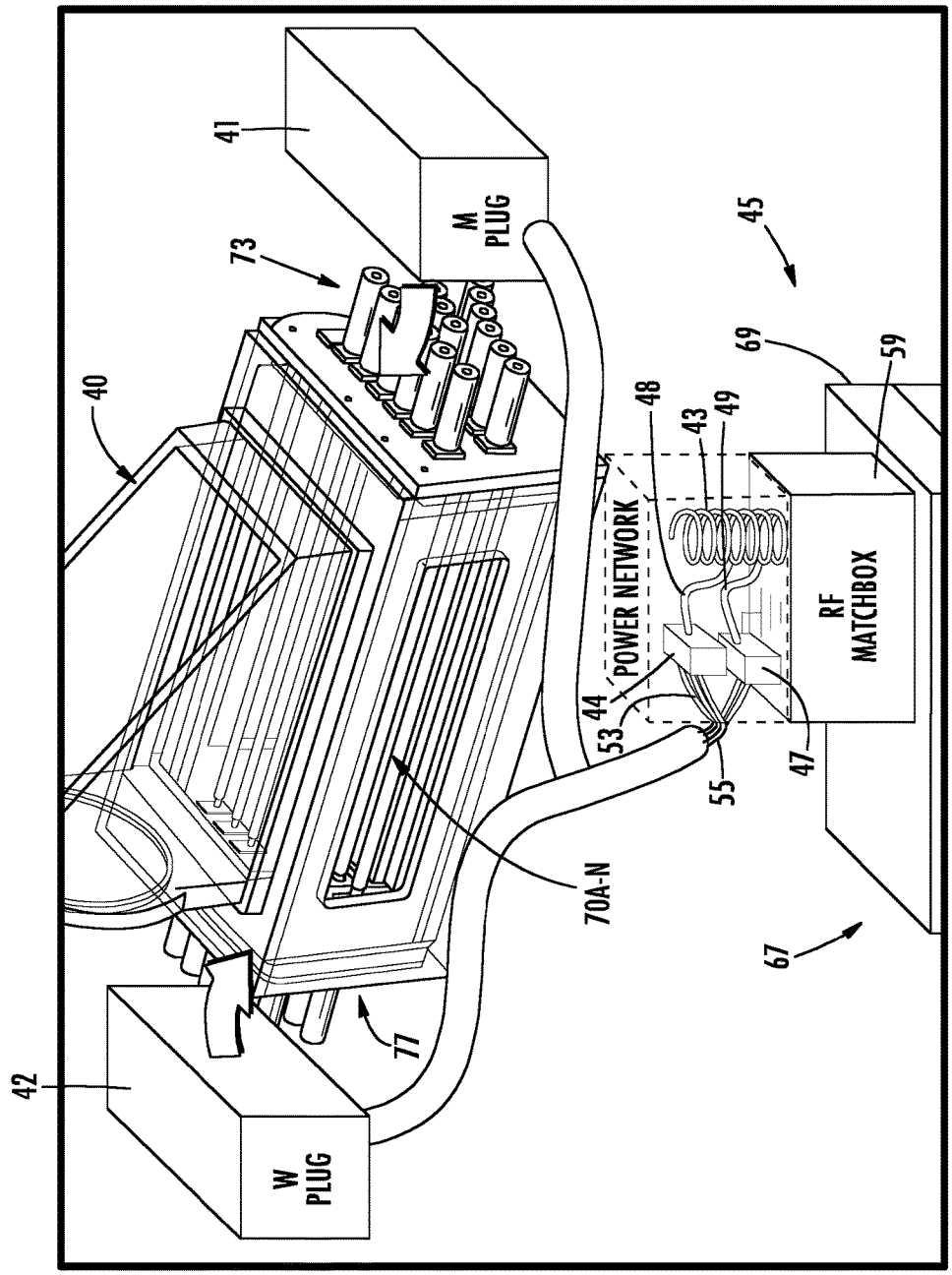
FIG. 4 is an isometric view illustrating the power supply system and the EPM of the ion implantation system shown in FIG. 1 in accordance with embodiments of the present disclosure.
Figure 5:
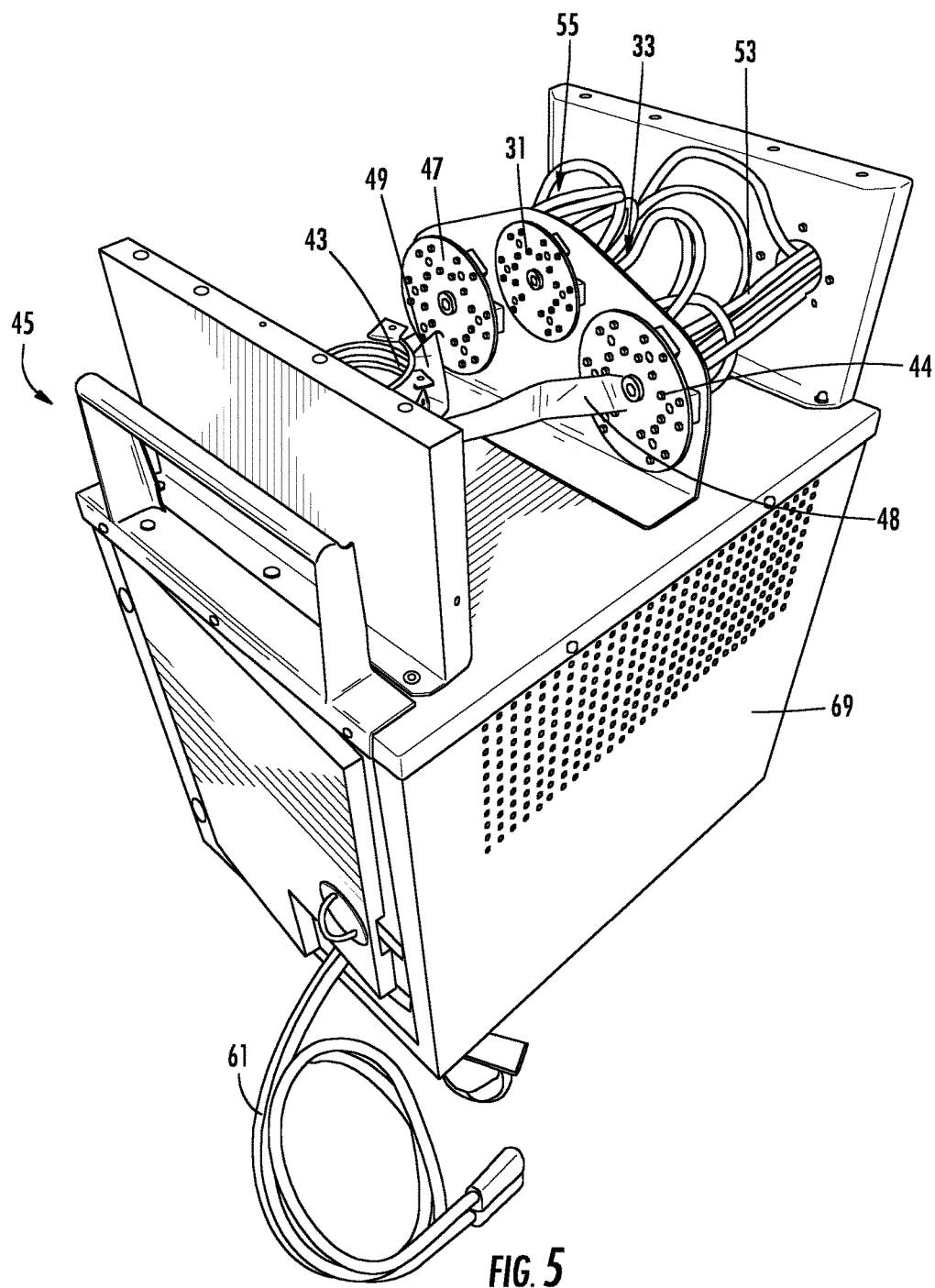
FIG. 5 is an isometric view illustrating the power supply system as part of a standalone unit in accordance with embodiments of the present disclosure.

Referring now to FIGS. 2, 4, and 5, the power supply system 45 of the present disclosure will be described in greater detail. As shown, the power supply system 45 is operable with the EPM 40 and allows plug-and-play functionality through the use of a first power plug 41 coupled to the first end 73 of the plurality of the conductive beam optics 70A-N and a second power plug 42 coupled to the second end 77 of the plurality of conductive beam optics 70A-N. The power supply system 45 further includes an inductor 43 (e.g., an inductor coil), and a first power distribution plate 44 and a second power distribution plate 47 electrically coupled to the inductor 43, for example, by first and second conductive elements 48, 49 (e.g., copper strips). A first group of connection cables 53 and a second group of connection cables 55 respectively couple the first and second power distribution plates 44 and 47 to the first and second power plugs 41, 42. In exemplary embodiments, the first and second power distribution plates 44 and 47 are six-terminal distribution disks connecting a corresponding number (6) of connector cables to each respective power plug 41, 42. As will be described in greater detail below, the first power distribution plate 44 is electrically coupled with a first subset of the plurality of conductive beam optics 70A-N, and the second power distribution plate 47 is electrically coupled with a second subset of the plurality of conductive beam optics 70A-N.

The power supply system 45 may further include a focus distribution plate 31 disposed in proximity (e.g., equidistant between) the first and second power distribution plates 44, 47. The focus distribution plate 31 may be electrically coupled with a third subset (e.g., focus conductive beam optics 70E-F) of the plurality of conductive beam optics 70A-N via a third group of connector cables 33. In one non-limiting embodiment, the focus distribution plate 31 is a four-terminal distribution disk for connection to each end of the focus electrodes 70E-F.

In exemplary embodiments, the focus distribution plate 31 may not be directly electrically coupled with the inductor 43, for example, by a copper element like in the case of the first and second distribution plates 44, 47. Instead, the oscillating voltage from the nearby first and second power distribution plates 44, 47 can capacitively or inductively couple to the focus distribution plate 31 devoid a direct physical/electrical connection to provide a reduced amount of RF power to the focus conductive beam optics 70E-F. This provides an advantage over prior approaches connecting deceleration and focus conductive beam optics simultaneously, resulting in an unstable condition with the relatively smaller focus conductive beam optics overwhelming the plasma density due to a lower impedance. In the embodiments of the disclosure, the location of the focus distribution plate 31 relative to the first and second power distribution plates 44, 47 makes possible supplying RF power to the focus conductive beam optics 70E-F devoid direct connection through a power splitter. Furthermore, equilibrating a correct ratio of power among the plurality of conductive beam optics 70A-N may be accomplished by adjusting the distance and/or material between the first and second distribution plates 44 and 47, e.g., by using a dielectric material instead of air. In one embodiment, automated adjustment using a motorized focus distribution plate may provide process control over the plasma density ratio between the deceleration and focus conductive beam optics.

The power supply system 45 may further include an RF generator (power supply) 57 and an RF matchbox 59 operably coupled to the RF generator 57, wherein the RF matchbox 59 may include the inductor 43. For the RF matchbox 59 shown, the inductor 43 is connected to an output of the RF matchbox 59 externally to the unit to obtain a good match. In other embodiments, the RF matchbox 59 may operate devoid an inductor. In yet other embodiments, the power supply system 45 may further include ground cables and plumbing lines 61. In some embodiments, the RF generator may operate at 13 MHz. In other embodiments, the RF generator may operate at 40 kHz, 2 MHz, 40 MHz, or other frequencies. Depending on the operating frequency of the RF generator, some embodiments may not need an RF matchbox to obtain a good impedance match to the power supply system 45.

As further shown, the power system 45 may contain a control computer 63, an optical emission spectroscopy (OES) unit 65 with fiber optic for end-point testing, and a video camera (not shown) for monitoring plasma density during the cleaning process. As demonstrated, the power supply system 45 may be part of a portable standalone unit 67, including a cart 69 capable of being moved between components of the system 10 (FIG. 1). The increased portability afforded by the standalone unit 67 enables tool-to-tool maintenance. Furthermore, the standalone unit 67 may remain inside a tool enclosure to enable easy connection with tool facilities (e.g., power, water, and VCS control loop), and then provide the clean sequence from software within or operable with the control computer 63.

In some cases, to enable each component of the system 10 (e.g., the EPM 40) to self-clean, the components of the system 10 may be upgraded for compatibility with and serviceability by the standalone unit 67. For example, the EPM 40 may include a pressure control valve (not shown) on a foreline of a rough pump to control the pressure during the RF clean process. Additional plumbing connections may integrate the pressure control valve. The standalone unit 67 may further include software operable to recognize and/or operate an RF clean semi-automated preventative maintenance procedure. After upgrading the hardware and software of each component, the standalone unit 67 can support a preventative maintenance procedure for the beam-line components 16.

Figure 6:
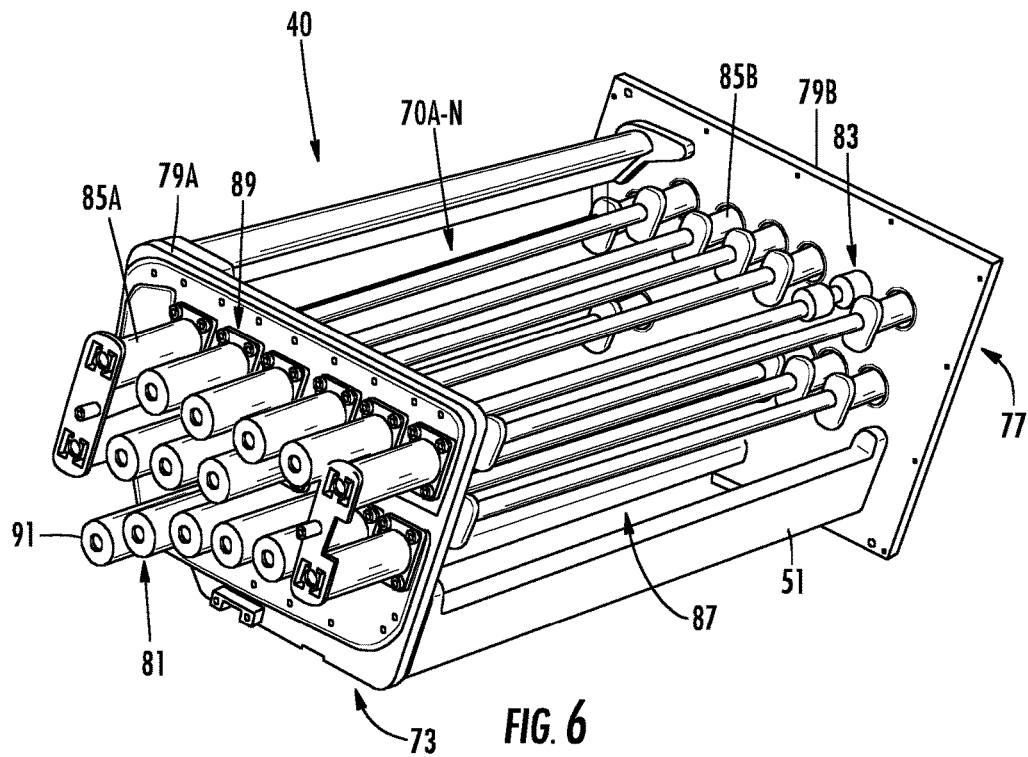
FIG. 6 is an isometric view illustrating the EPM of the ion implantation system shown in FIG. 1 in accordance with embodiments of the present disclosure.
Figure 7:
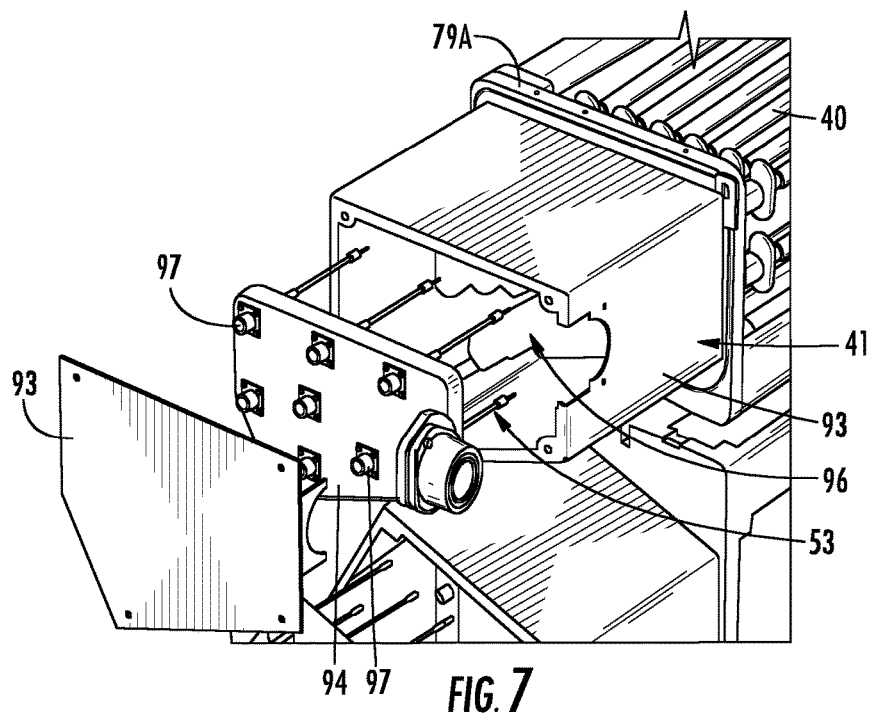
FIG. 7 is a partially exploded isometric view illustrating a power plug of the power supply system shown in FIG. 1 in accordance with embodiments of the present disclosure.
Figure 8:
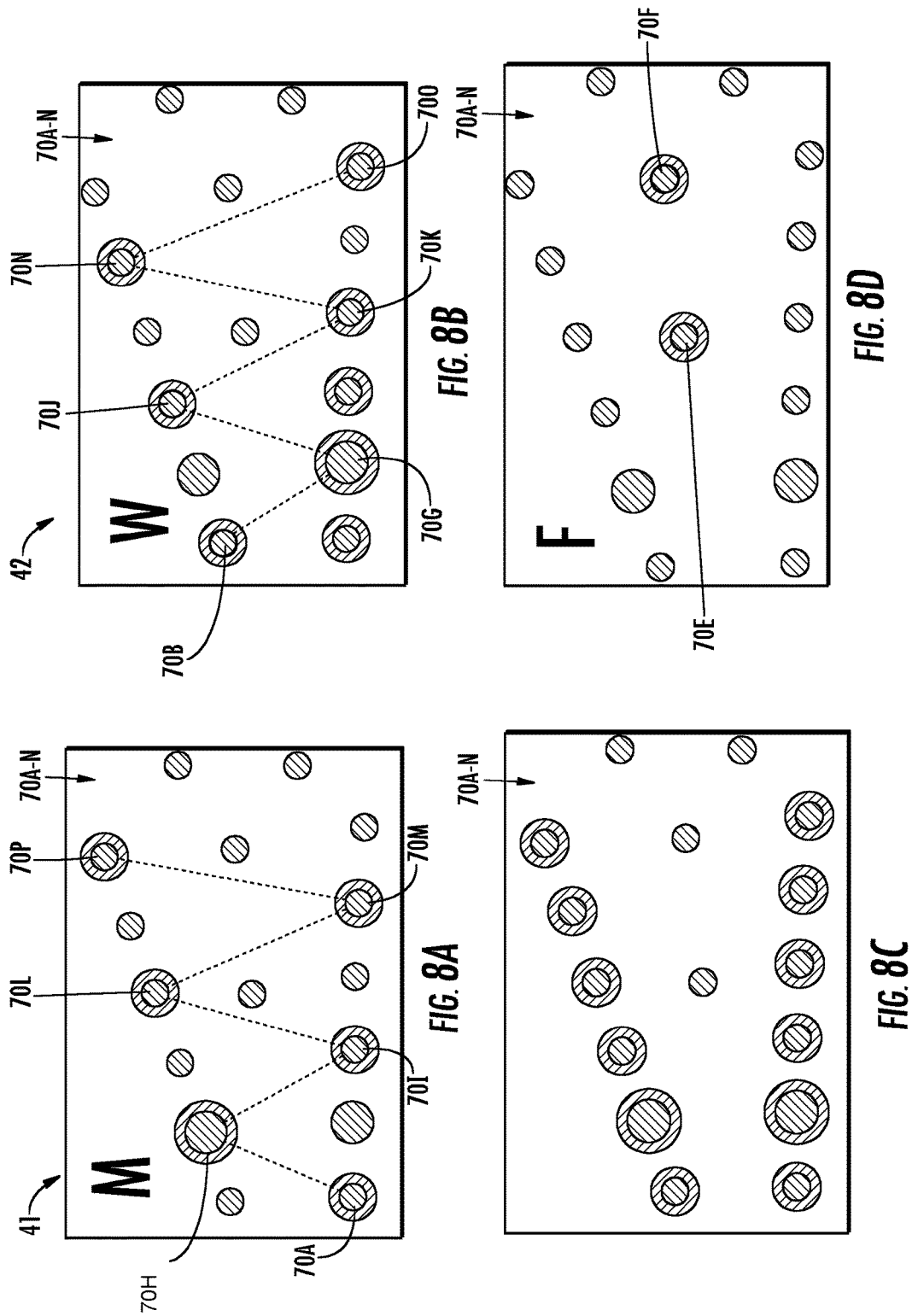
FIGS. 8A-8D demonstrate various power schemes for the EPM in accordance with embodiments of the present disclosure.

Turning now to FIGS. 6-7, connection of the first power plug 41 with the EPM 40 will be described in greater detail. Although connection of just the first power plug 41 is shown in detail, one will appreciate the second power plug 42 will have a similar connection and components as the first power plug 42, except where noted. As shown, the EPM 40 includes the frame 51 having a set of opposing sidewalls 79A-B defining an interior area 87 housing the plurality of conductive beam optics 70A-N. The EPM 40 further includes multiple feedthrough components 81 extending through openings 83 of each of the opposing sidewalls 79A-B. The feedthrough components 81 each include a first section 85A disposed external to the interior area 87 defined by the opposing sidewalls 79A-B, and a second section 85B disposed within the interior area 87. The feedthrough components 81 may be coupled to the sidewalls 79A-B via a set of feedthrough fasteners 89. In exemplary embodiments, the feedthrough components 81 may be female feedthrough connectors each including a receptacle 91 for enabling electrical connections.

The first power plug 41 may include a housing 93 coupled to the sidewall 79A, and a plate 94 coupled to the feedthrough components 81. In exemplary embodiments, the plate 94 aligns each of the first group of connection cables 53 with corresponding banana plug connectors 96 on each end thereof. As shown, the plate 94 may include a total of eight (8) terminals 97, namely six (6) terminals corresponding to top and bottom accel/decel conductive beam optics, and two (2) terminals corresponding to focus conductive beam optics.

The second power plug 42 coupled at the other end 77 of the EPM 40 may have an opposite/alternate arrangement of terminals than the first power plug 41 for collectively powering each of the plurality of conductive beam optics 70A-N, as will now be described in greater with respect to FIGS. 8A-8D. As shown, FIG. 8A demonstrates the plurality of conductive beam optics 70A-N connected to and powered by the first power plug 41. Because the first power plug 41 contains just 6 terminals and corresponding connection cables, just a first subset, e.g., conductive beam optics 70A, 70H, 70I, 70L, 70M and 70P of the plurality of conductive beam optics 70A-N, are powered by the first power plug 41 at the first end 73. As shown, conductive beam optics 70A, 70H, 70I, 70L, 70M and 70P are powered in a generally "M" shaped zig-zag configuration, and correspond to ½ of the deceleration rods of the conductive beam optics 70A-N.

FIG. 8B demonstrates the plurality of conductive beam optics 70A-N connected to and powered by the second power plug 42. Because the second power plug 42 contains just 6 terminals and corresponding connection cables, just a second subset, e.g., conductive beam optics 70B, 70G, 70J, 70K, 70N and 70O of the plurality of conductive beam optics 70A-N, are powered by the second power plug 42 at the second end 77. As shown, conductive beam optics 70B, 70G, 70J, 70K, 70N and 70O are powered in a generally "W" shaped zig-zag configuration, and correspond to the other ½ of the deceleration rods of the conductive beam optics 70A-N.

The "M" and "W" powering configurations are complimentary, and ensure all of the plurality of conductive beam optics 70A-N may be simultaneously powered by the first and second power plugs 41 and 42, as demonstrated in FIG. 8C. By powering "M" and "W" electrodes simultaneously, yet from opposite ends, an effective RF clean can be achieved with a unitary hookup procedure, e.g., in less than one hour of clean time, even if the focus rods are significantly coated with residue. An optional focus electrode clean cycle may then be performed on at least one additional conductive beam optic, e.g., focus conductive beam optics 70E-F, as demonstrated in FIG. 8D. In various embodiments, the focus conductive beam optics 70E-F may be powered concurrently or consecutively with the rest of the conductive beam optics 70A-N.

Figure 9:
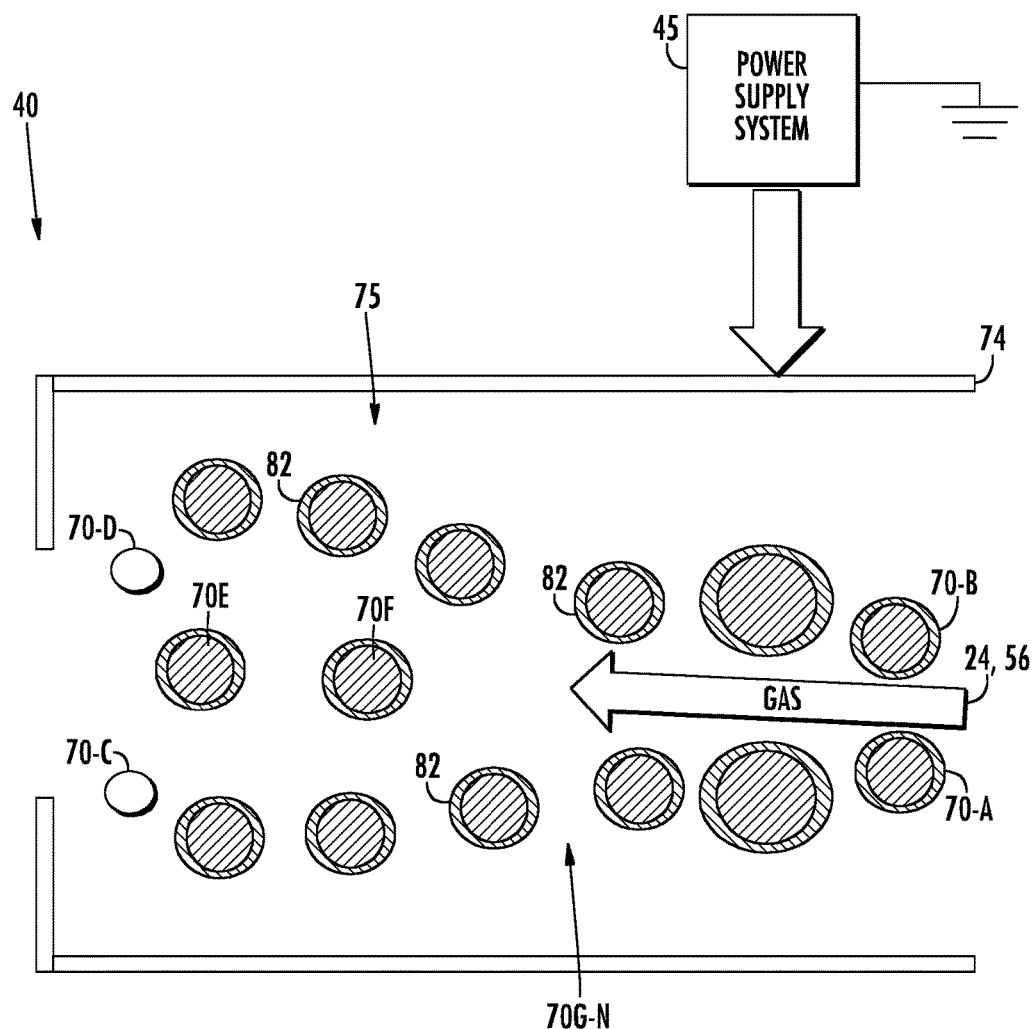
FIG. 9 is a partial side cutaway view of the EPM of the ion implantation system shown in FIG. 1 in accordance with embodiments of the present disclosure.

Turning now to FIG. 9, an RF cleaning mode will be described in greater detail. In some embodiments, to start the cleaning mode, the EPM 40 may be switched from the processing mode to the cleaning mode, for example, using a relay switch (not shown) for switching between the processing mode of the operating power supply 76 and the cleaning mode of the power supply 45. In one embodiment, switching from the processing mode to the cleaning mode is performed automatically, for example, in the case a predetermined threshold (e.g., a set number of beam glitches) is achieved. In another embodiment, the switching can be triggered by an operator.

In exemplary embodiments, the EPM 40 may be in situ cleaned during the cleaning mode. To accomplish this, an etchant gas, such as gas 24 and/or gas 56, may be introduced into the EPM 40 at a selected flow/injection rate. For example, the etchant gas may be introduced at a flow rate of approximately 25 standard cubic centimeters per minute (SCCM) to approximately 200 SCCM. In one embodiment, the etchant gas may be introduced at approximately 50 SCCM to approximately 100 SCCM to maintain high pressure flow around the conductive beam optics 70A-N.

Various species may be introduced as the cleaning agent of the etchant gas. The cleaning agent may be atomic or molecular species containing chemically reactive species. Such species, when ionized, may chemically react with the deposits accumulated on one or more of the conductive beam optics 70A-N. Although a cleaning agent with chemically reactive species will be described herein, the present disclosure does not preclude utilizing chemically inert species. In another embodiment, the cleaning agent may contain heavy atomic species to form ions with high atomic mass units (amu) when ionized. Non-limiting examples of the cleaning agent may include atomic or molecular species containing H, He, N, O, F, Ne, Cl, Ar, Kr, and Xe, or a combination thereof. In one embodiment, $NF_3$, $O_2$, or a mixture of Ar and $F_2$, or a combination thereof, may be used as the cleaning agent.

The composition of the etchant gas can be chosen to optimize chemical etching based on a composition of the deposit(s) formed on the conductive beam optics 70A-N. For example, fluorine-based plasmas may be used to etch beam components containing B, P, and As, while oxygen-based plasmas may be used to etch photoresist materials. In one embodiment, adding Ar or other heavy species to the plasma mixture increases ion bombardment, resulting in an improved removal rate of the deposit(s) from the conductive beam optics 70A-N when using a chemically enhanced ion sputtering process. Plasma or ion bombardment also provokes heating of the surfaces to aid chemical etch rates and to help agitate the deposit(s) from the surface of the conductive beam optics 70A-N.

As shown, operation of the EPM 40 in the cleaning mode results in a plasma 82 being formed along the plurality of conductive beam optics 70A-N. In the present embodiment, the plasma 82 may be created in the volume defined by the housing 74 by providing continuous or pulsed AC/DC voltage to the conductive beam optics 70A-N. For example, approximately 400 V to 1 kV at approximately 1 A to approximately 5 A of current may be supplied to the conductive beam optics 70A-N using the RF power supply system 45. The power may be in the form of AC voltage or pulsed DC voltage to the conductive beam optics 70A-N. As stated above, the conductive beam optics 70A-N may be driven from opposite sides by the first and second power plugs 41 and 42 to provide a more efficient and uniform generation of the plasma 82.

To further increase the density and localization of the plasma 82 within the EPM 40, a pressure within the EPM 40 may be adjusted. Specifically, by increasing the pressure set point for the cleaning process, either by increasing the gas injection rate or reducing the pump rate to the EPM 40, the plasma 82 may be further focused around the conductive beam optics 70A-N. Localized/selective plasma generation is useful to minimize the impact of harmful radicals (e.g., fluorine) to other parts of the EPM 40, in order to prevent etching and damaging of heavy metal (e.g., steel) parts. Furthermore, a higher flow rate through the EPM 40 can allow for faster replacement of etch by-products with fresh reactants, producing a more efficient clean process.

In some embodiments, the ions in the plasma 82 may remove accumulated deposits from one or more of the conductive beam optics 70A-N via an ion sputtering process. The heat generated from the cleaning plasma 82 may also enhance the cleaning process as the deposits accumulated on the conductive beam optics 70A-N may be removed by the heat or may become more volatile with increased temperature. For example, the conductive beam optics 70A-N may be provided with a voltage of between 400 and 1000V at a current of between 1 to 5 amps. Thus, up to approximately 5 kW of heat may be generated. By providing highly reactive and/or heavy cleaning species, and generating the plasma 82 near the conductive beam optics 70A-N, effective plasma cleaning may be performed. As noted above, a high flow rate of the cleaning materials introduced into the EPM 40 may enhance the cleaning process.

To increase the density and localization of the plasma 82 within the housing 74, a pressure of the environment 75 may be increased. Specifically, by increasing the pressure set point for the cleaning process, either by increasing the gas injection rate or reducing the pump rate to the housing 74, the plasma 82 may be localized around one or more of the conductive beam optics 70A-N.

Figure 10:
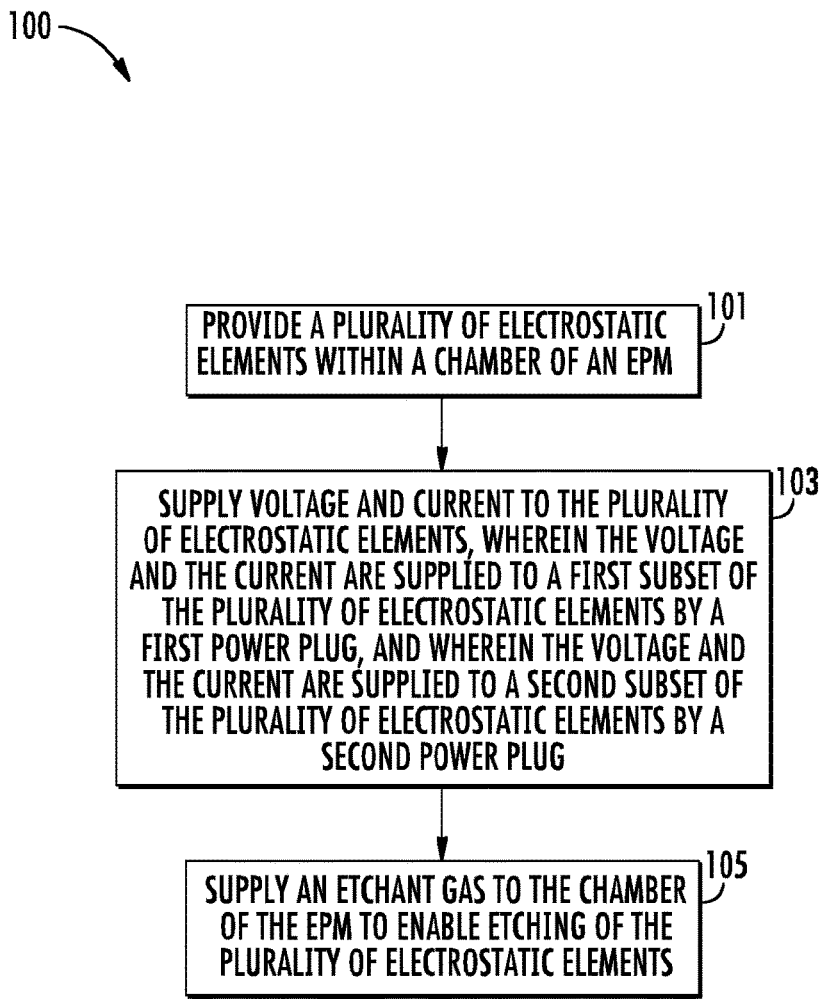
FIG. 10 is a flowchart illustrating an exemplary method in accordance with embodiments of the present disclosure.

Referring now to FIG. 10, a flow diagram illustrating an exemplary method 100 for in-situ plasma cleaning the EPM of the ion implantation system in accordance with the present disclosure is shown. The method 100 will be described in conjunction with the representations shown in FIGS. 1-9.

Method 100 includes providing a plurality of electrostatic elements within a chamber of an EPM, as shown at block 101, wherein the plurality of electrostatic elements has a first end and a second end. In some embodiments, the plurality of electrostatic elements is a plurality of conductive beam optics. In some embodiments, the plurality of conductive beam optics includes a plurality of graphite electrode rods. In some embodiments, the plurality of electrostatic elements includes a first row of acceleration/deceleration conductive beam optics disposed along a first side of an ion beam-line, a second row of acceleration/deceleration conductive beam optics disposed along a second side of the ion beam-line, and a set of focus conductive beam optics between the first and second rows of acceleration/deceleration conductive beam optics.

Method 100 further includes supplying a voltage and a current to the plurality of electrostatic elements during a cleaning mode to generate the plasma around the plurality of electrostatic elements, as shown at block 103. In some embodiments, the voltage and the current are supplied to a first subset of the plurality of electrostatic elements by a first power plug, and the voltage and the current are supplied to a second subset of the plurality of electrostatic elements by a second power plug. In some embodiments, the voltage and the current are supplied to the first subset of the plurality of electrostatic elements by the first power plug at a first end of the plurality of electrostatic elements. The voltage and the current are also supplied to the second subset of the plurality of electrostatic elements at a second end of the plurality of electrostatic elements. In some embodiments, the voltage and current are split between the first and second power plugs, yet simultaneously supplied, so all of the plurality of conductive beam optics may be collectively powered. In some embodiments, a first power distribution plate is coupled with the first subset of plurality of electrostatic elements and a second power distribution plate is coupled with the second subset of plurality of electrostatic elements. In some embodiments, a focus distribution plate positioned between the first and second power distribution plates may be inductively powered. In some embodiments, just the first and second power distribution plates may be directly electrically coupled to an inductor.

Method 100 may include supplying an etchant gas to the chamber of the EPM to enable etching of the plurality of electrostatic elements, as shown at block 105.

In view of the foregoing, at least the following advantageous effects are achieved by the embodiments disclosed herein. Firstly, the plasma cleaning may be performed over a short time, advantageously avoiding the need to vent and/or manually clean the component. Secondly, during in-situ plasma cleaning, the plasma density is greater and more uniform surrounding those components to be cleaned, thus advantageously reducing unintended etching to other components of the beam-line and/or the system. Thirdly, the power supply system may be combined/configured as a portable and standalone unit, advantageously enabling the ability to quickly connect and interface with various components of the ion implantation system. Fourthly, devoid major modifications to current EPM design, an in-situ cleaning mode can employ high gas flow rates, chemically reactive species formation, ion bombardment, and surface heating for an advantageous highly efficient RF clean process.

While certain embodiments of the disclosure have been described herein, the disclosure is not limited thereto, as the disclosure is as broad in scope as the art will allow and the specification may be read likewise. Therefore, the above descriptions are not to be construed as limiting. Those skilled in the art will envision other modifications within the scope and spirit of the claims appended hereto.

The invention claimed is:

1. An ion implantation system, comprising:
 a chamber;
 an electrostatic filter disposed within the chamber, the electrostatic filter comprising:
 a frame;
 a plurality of electrostatic electrodes extending between sidewalls of the frame; and
 a plurality of feedthrough components coupled to corresponding electrostatic electrodes, of the plurality of electrostatic electrodes, the plurality of feedthrough components extending through the frame; and a power supply system in communication with the plurality of electrostatic electrodes, the power supply system comprising a first power plug and a second power plug for supplying a voltage and a current to the plurality of electrostatic electrodes during an in-situ plasma cleaning mode of the plurality of electrodes, the first power plug coupled to a first subset of the plurality of electrostatic electrodes and the second power plug coupled to a second subset of the plurality of electrostatic electrodes, wherein the first power plug comprises a housing physically coupleable with the frame of the electrostatic filter.

2. The ion implantation system of claim 1, further comprising:
   an inductor; and
   a first power distribution plate and a second power distribution plate electrically coupled to the inductor.

3. The ion implantation system of claim 2, wherein the first power distribution plate is electrically coupled with the first subset of the plurality of electrostatic electrodes, and wherein the second power distribution plate is electrically coupled with the second subset of the plurality of electrostatic electrodes.

4. The ion implantation system of claim 2, further comprising:
   a plurality of connection cables coupling the first and second power distribution plates to the first and second power plugs; and
   an additional distribution plate for powering at least one additional electrostatic electrode having a different electrical impedance than the plurality of electrostatic electrodes, wherein the additional distribution plate is disposed in proximity to at least one of: the first power distribution plate, the second power distribution plate, the inductor, and the plurality of connection cables.

5. The ion implantation system of claim 4, wherein the additional distribution plate is electrically coupled with the at least one additional electrostatic electrode.

6. The ion implantation system of claim 4, wherein the additional distribution plate receives power by capacitive coupling or inductive coupling from at least one of: the first power distribution plate, the second power distribution plate, the inductor, and the plurality of connection cables.

7. The ion implantation system of claim 4, wherein the plurality of electrostatic electrodes includes a first row of acceleration/deceleration conductive beam optics disposed along a first side of an ion beam-line, a second row of acceleration/deceleration conductive beam optics disposed along a second side of the ion beam-line, and wherein the at least one additional electrode includes a set of focus conductive beam optics between the first and second rows of acceleration/deceleration conductive beam optics.

8. The ion implantation system of claim 1, wherein the first power plug is coupled to a first end of the plurality of conductive beam optics and the second power plug coupled to a second end of the plurality of electrostatic electrodes.

9. The ion implantation system of claim 1, wherein the first power plug is coupled to a first end of the first subset of the plurality of electrostatic electrodes and the second power plug is coupled to a second end of the second subset of the plurality of electrostatic electrodes.

10. The ion implantation system of claim 1, wherein at least one of the first power plug and the second power plug includes a plurality of terminals directly coupled to corresponding feedthrough components of the plurality of feedthrough components.

* * * * *